United States Patent
Yang et al.

[11] Patent Number: 5,928,814
[45] Date of Patent: Jul. 27, 1999

[54] PHOTOMASK CONTROLLING TRANSMISSIVITY BY USING AN IMPURITY-CONTAINING FILM FORMED ON A TRANSPARENT SUBSTRATE

[75] Inventors: Seong Woo Yang; Myung Goon Gil, both of Kyoungkido, Rep. of Korea

[73] Assignee: Hyundai Electronics Industries Co., Ltd., Kyoungkido, Rep. of Korea

[21] Appl. No.: 08/819,560

[22] Filed: Mar. 14, 1997

[30] Foreign Application Priority Data

Mar. 14, 1996 [KR] Rep. of Korea .................. 96-6891

[51] Int. Cl.$^6$ ......................................... G03F 9/00
[52] U.S. Cl. ................................................. 430/5
[58] Field of Search ........................ 430/5, 322, 323, 430/324

[56] References Cited

U.S. PATENT DOCUMENTS

| | | | |
|---|---|---|---|
| 5,194,344 | 3/1993 | Cathey, Jr. et al. | 430/5 |
| 5,194,345 | 3/1993 | Rolfson | 430/5 |
| 5,384,218 | 1/1995 | Tokui et al. | 430/5 |
| 5,547,787 | 8/1996 | Ito et al. | 430/5 |
| 5,563,010 | 10/1996 | Hwang | 430/5 |
| 5,589,305 | 12/1996 | Tomofuji et al. | 430/5 |
| 5,700,606 | 12/1997 | Kobayashi et al. | 430/5 |

*Primary Examiner*—S. Rosasco
*Attorney, Agent, or Firm*—Jacobson, Price, Holman & Stern PLLC

[57] ABSTRACT

The present invention provides a photomask for forming excellent photoresist patterns without the decrease of a critical area and the bulk effect caused by the topology of a photoresist on formed a wafer, by making the mask have different transmissivity in accordance with the topology of a wafer surface. In forming first contact holes and second contact holes in photoresist film formed on a wafer, wherein the first contact holes are deeper than the second contact holes, the photomask comprises a transparent substrate, transmissivity controlling films positioned over areas in which the second contact holes are formed, and light blocking patterns. The impurities control transmissivity, by absorbing light.

8 Claims, 3 Drawing Sheets

PHOTOMASK CONTROLLING TRANSMISSIVITY BY USING AN IMPURITY-CONTAINING FILM FORMED ON A TRANSPARENT SUBSTRATE

BACKGROUND OF THE INVENTION

1. Field of the Invention

The present invention relates to semiconductor fabrication and more particularly to a reticle to form photoresist patterns used in the lithography process.

2. Description of the Prior Art

Generally, a phase shift mask or a chromium mask have been used in the step-and-repeat reduction projection system which forms a method to form a contact hole in semiconductor devices. FIG. 1 is a cross-sectional view illustrating a method for fabricating the conventional chromium mask (retitle). As shown in FIG. 1, a chromium film 2 is formed on a transparent quartz substrate 1 and the chromium film 2 is coated with a photoresist film 3. To form patterns on the transparent quartz substrate 1, the photoresist film 3 is developed after the E-beam writing process is performed so that a plurality of parts of the photoresist film 3 are removed in accordance with a predetermined pattern designed by a manufacturer, exposing the chromium film 2. By doing so, the chromium patterns may be formed on the transparent quartz substrate 1.

FIG. 2 is a cross-sectional view illustrating an exposure process for forming a contact hole using the mask having the chromium patterns of FIG. 1. To give a brief explanation of the exposure process in the step-and-repeat reduction projection system, there is shown only the chromium patterns 3a, a wafer 7 and a photoresist film 8. It should be noted that a photoresist film 8 is formed on the wafer 7 having an uneven surface so that the thickness of the photoresist film 8 is not uniform.

Accordingly, this uneven surface of the wafer 7 may cause the photoresist film 8 to have the thickness difference between the thick area A and thin area B thereof. As a result, in the case where the light source applies exposure light to the photoresist film 8 through the reticle, it is very difficult to perform the exact exposure process suitable for the whole area. Since the thickness of the photoresist film 8 in the area A is thick, the critical area, which is exposed to the light source in the area A, may be narrower than that in the area B. Due to this decrease of the critical area, when the worst comes to the worst, the photoresist patterns may not be generated on the wafer 7. On the contrary, the critical area, which is exposed to the light source in the area B, may be broader than that in the area A. In this case, when the worst comes to the worst, the bulk effect may be generated by the connection between neighboring patterns.

Therefore, in the case where contact holes are formed by the above conventional photomask (or reticle), contact holes become much smaller so that they are not opened or they becomes much larger so that holes are connected to a neighboring hole, causing poor chromium patterns.

SUMMARY OF THE INVENTION

It, therefore, is an object of the present invention to provide a photomask for forming excellent photoresist patterns without the decrease of a critical area and the bulk effect caused by the topology of a photoresist formed o a wafer, by making the mask have different transmissivity in accordance with the topology of a wafer surface.

In accordance with an aspect of the present invention, there is provided a photomask for forming photoresist patterns on a wafer, the photomask comprising: a transparent substrate; at least one transmissivity controlling film containing impurities diffused thereinto, wherein the impurities absorb light; and light blocking patterns.

In accordance with another aspect of the present invention, there is provided a photomask for forming first contact holes and second contact holes in photoresist film formed on a wafer, wherein the first contact holes are deeper than the second contact holes, the photomask comprising: a transparent substrate; transmissivity controlling films positioned over areas in which the second contact holes are formed, containing impurities absorbing light; and light blocking patterns.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

In the following description, the specific details are set forth to provide a more thorough understanding of the present invention. It will be apparent, however, to one skilled in the art, that the present invention may be practiced without these specific details. In other instances, well known features have not been described in detail so as not to obscure the present invention.

Figure 1:
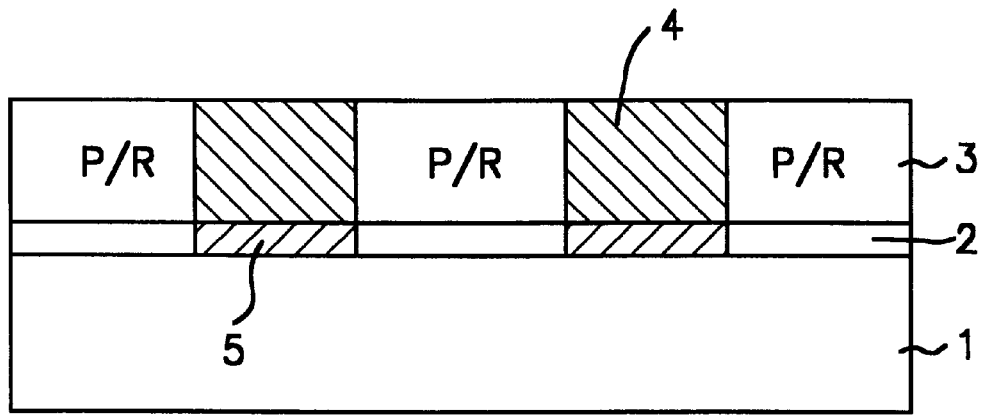
FIG. 1 is a cross-sectional view illustrating a method for fabricating the conventional chromium mask.
Figure 2:
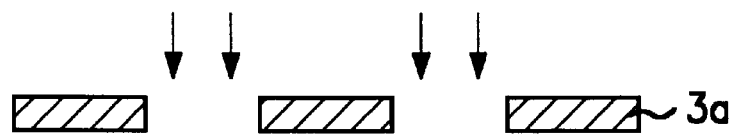
FIG. 2 is a cross-sectional view illustrating an exposure process for forming a contact hole in accordance with the mask having chromium patterns of FIG. 1.
Figure 2:
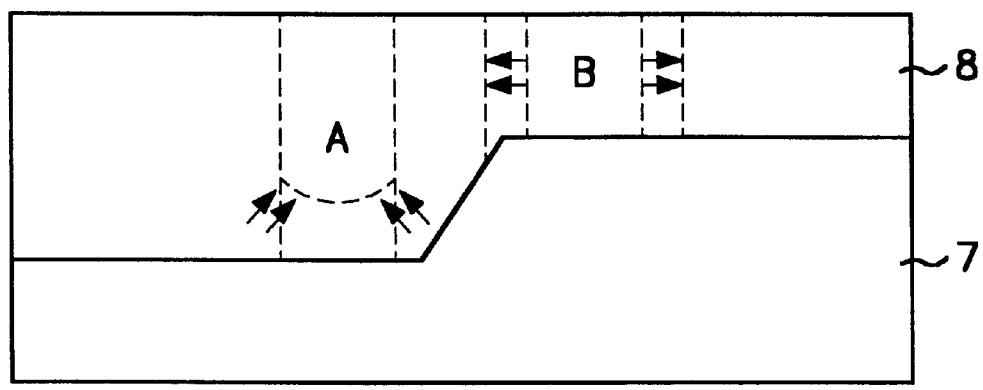
Figure 3A:
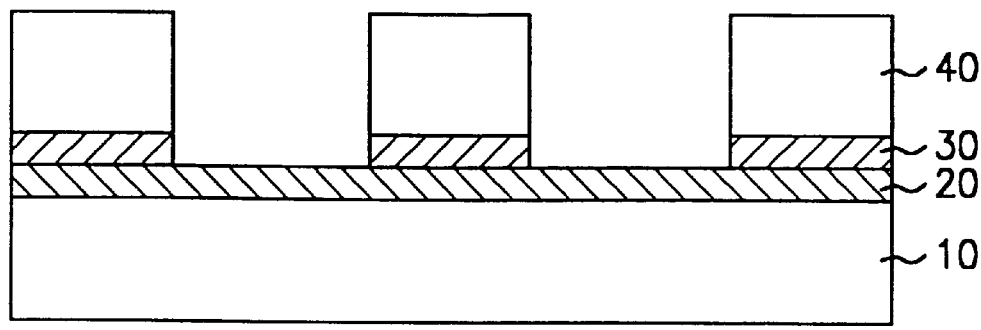
FIGS. 3A through 3C are cross-sectional views illustrating a mask for forming contact holes on a wafer having an uneven surface according to the present invention.
Figure 3B:
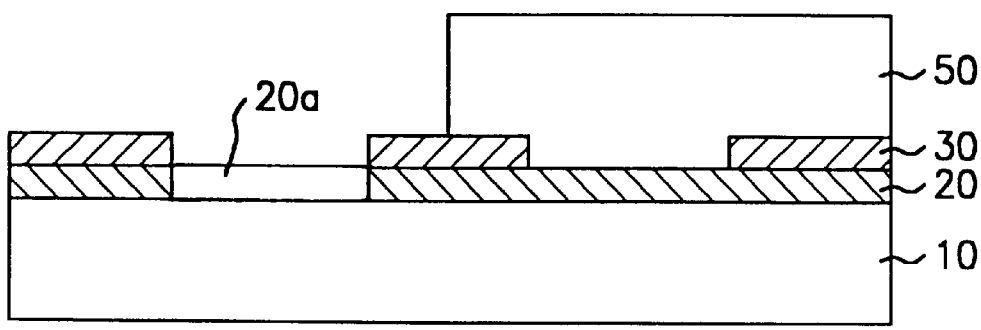
Figure 3C:
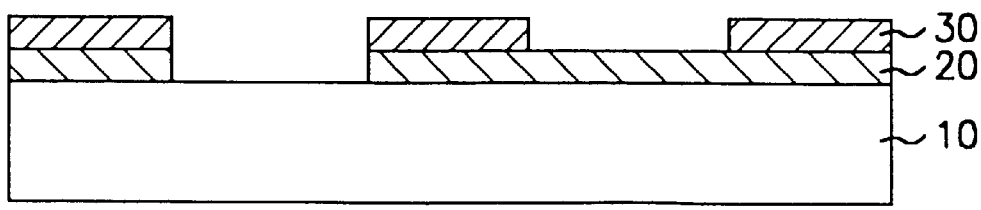

First, FIGS. 3A through 3C are cross-sectional views illustrating a mask for forming contact hole on a wafer which has an uneven surface according to the present invention.

An impurity-containing quartz film 20, a chromium film 30 and a photoresist film 40 are, in order, formed on a transparent quartz substrate 10. The impurity-containing quartz film 20 is manufactured, by diffusing impurities, such as nitrogen, silicon, oxygen and fluorine, to a transparent quartz film. The impurities which are diffused into the quartz film reduce the transmissivity of light. After forming the photoresist film 40, the E-beam writing process is applied to the photoresist film 40 to be developed. A plurality of parts of the irradiated photoresist film 40 by the E-beam writing process are removed and the exposed chromium film 30 is selectively etched using the photoresist patterns as an etching barrier film. Of course, the type of the photoresist film is selected from one of the positive and negative photoresist films, and it would be obvious to those having ordinary skill in the arts to which the subject matter pertains.

Next, referring to FIG. 3B, after the removal of the photoresist film 40, the photoresist film 50 is formed on the resulting structure and the E-beam writing process is applied to the photoresist film 50. The impurity-containing quartz film 20 is exposed through the development process of the photoresist film 50. At this time, the irradiation of the photoresist film 50 should be carried out, concerning the thickness of the photoresist film to be formed on a wafer having an uneven surface. That is to say, this secondary irradiation is carried out to remove the impurity-containing quartz film 20a which is to be positioned over the thick region of a photoresist film to be formed on a wafer having an uneven surface.

Finally, referring to FIG. 3C, the exposed quartz film 20 and the photoresist film 50 are removed so that two different transmission areas may be formed on the transparent quartz substrate 10.

Figure 4:
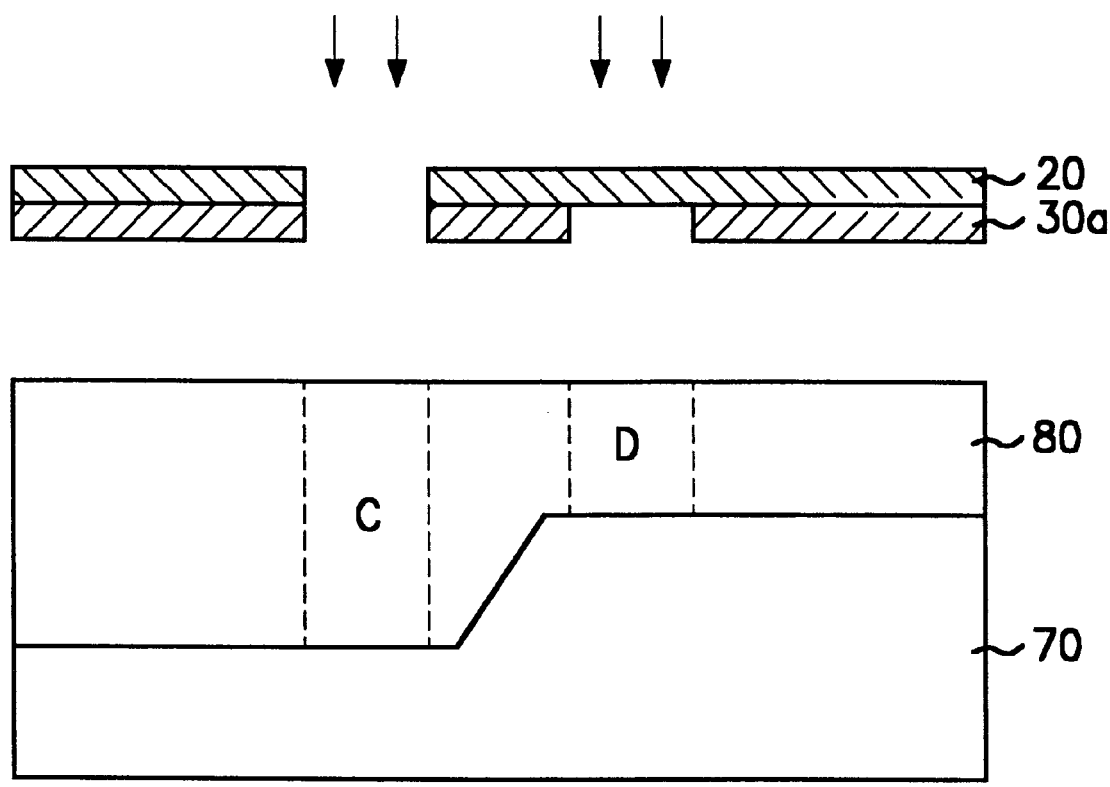
FIG. 4 is a cross-sectional view illustrating an exposure process for forming a contact hole in accordance with the chromium mask with an impurity-containing quartz film of FIG. 3C.

FIG. 4 is a cross-sectional view illustrating an exposure process for forming a contact hole in accordance with the chromium mask with the impurity-containing quartz film in FIG. 3C, in which there is shown a photoresist film 80 formed on a wafer 70 having an uneven surface. Since the thickness of the photoresist film 80 in the area C is thicker than that in the area D due to the topology of the wafer 70, the one mask, which has the high transmissivity by means of the removal of the impurity-containing quartz film 20 and the low transmissivity by means of the impurity-containing quartz film is positioned over the areas C and D. Of course, a chromium pattern 30a is formed on the impurity-containing quartz film 20 to block exposure light irradiated onto other areas.

Accordingly, since the transmissivity in the area C is higher than that in the area D, it is not necessary to increase the light intensity to form the contact hole in the area C, causing the bulk effect. Further, because it is not necessary to increase the light intensity, the exposed area in the area D may be prevented from being extended to the neighboring patterns.

As apparent stated above, the present invention prevents poor patterns, such as a bulk effect, from being generated, by making the mask have different transmissivity in accordance with the topology of the wafer surface. Therefore, the present invention has effects on the improvement of yield and quality in the semiconductor devices.

What is claimed is:

1. A photomask for forming photoresist patterns on a wafer having an uneven surface portion so that the photoresist patterns contain a first portion, a thickness of the first portion being greater than that of a second portion, the photomask comprising:

a transparent substrate;

light blocking patterns deposited on said (quartz) transparent substrate; and an impurity-containing transparent film deposited on at least a portion of said transparent substrate which is not covered by said light blocking pattern and corresponds to the second portion, for absorbing a portion of light transmitted through said transparent substrate, wherein said impurity-containing transparent film is formed by using an impurity deffusion process performed on a transparent film and an impurity includes at least one from the group consisting of silicon, nitrogen, oxygen and fluorine.

2. The photomask in accordance with claim 1, wherein the transparent substrate is made of a quartz.

3. The photomask in accordance with claim 1, wherein said impurity-containing transparent film is extended onto areas between said transparent substrate and said light blocking patterns.

4. The photomask in accordance with claim 3, wherein said light blocking patterns are made of a chromium film.

5. A photomask for forming first contact holes and second contact holes on a wafer, wherein the first contact holes are deeper than the second contact holes, the photomask comprising:

a transparent substrate;

impurity-containing transparent films positioned over areas in which the second contact holes are formed, for absorbing a portion of light transmitted through the transparent substrate, wherein said impurity-containing transparent film is formed by using an impurity deffusion process performed on a transparent film and an impurity includes at least one from the group consisting of silicon, nitrogen oxygen and fluorine; and light blocking patterns covering areas in which the first and the second contact holes are not formed.

6. The photomask in accordance with claim 5, the transparent substrate is made of a quartz.

7. The photomask in accordance with claim 6, wherein said impurity-containing transparent film is extended onto areas between said transparent substrate and said light blocking patterns.

8. The photomask in accordance with claim 7, wherein said light blocking patterns are made of a chromium film.

* * * * *